United States Patent
Vetter

(10) Patent No.: US 7,935,426 B2
(45) Date of Patent: May 3, 2011

(54) LAYER ARRANGEMENT FOR THE FORMATION OF A COATING ON A SURFACE OF A SUBSTRATE, COATING METHOD, AND SUBSTRATE WITH A LAYER ARRANGEMENT

(75) Inventor: Joerg Vetter, Bergisch Gladbach (DE)

(73) Assignee: Sulzer Metaplas GmbH, Bergisch-Gladbach (DE)

( * ) Notice: Subject to any disclaimer, the term of this patent is extended or adjusted under 35 U.S.C. 154(b) by 824 days.

(21) Appl. No.: 11/580,571

(22) Filed: Oct. 13, 2006

(65) Prior Publication Data
US 2010/0304102 A1 Dec. 2, 2010

(30) Foreign Application Priority Data

Nov. 4, 2005 (EP) .................................. 05405620

(51) Int. Cl.
*B32B 7/02* (2006.01)
*B32B 9/00* (2006.01)
*C23C 14/06* (2006.01)
*C23C 14/35* (2006.01)
*C23C 14/24* (2006.01)
*C09D 1/00* (2006.01)

(52) U.S. Cl. ........ 428/446; 428/213; 428/448; 428/336; 428/701; 428/688; 428/689; 428/698; 428/627; 106/286.8; 416/241 R; 416/241 B; 204/192.16; 204/192.38

(58) Field of Classification Search .................. None
See application file for complete search history.

(56) References Cited

U.S. PATENT DOCUMENTS

| 5,882,778 | A | 3/1999 | Sugizaki et al. | |
|---|---|---|---|---|
| 6,586,122 | B2 * | 7/2003 | Ishikawa et al. | 428/698 |
| 7,166,155 | B2 * | 1/2007 | Ishikawa | 106/286.2 |
| 7,348,074 | B2 * | 3/2008 | Derflinger | 428/699 |
| 7,431,988 | B2 * | 10/2008 | Hanyu et al. | 428/408 |
| 7,504,149 | B2 * | 3/2009 | Toihara et al. | 428/216 |
| 7,618,720 | B2 | 11/2009 | Derflinger | |

(Continued)

FOREIGN PATENT DOCUMENTS

EP 0502399 A2 9/1992

(Continued)

OTHER PUBLICATIONS

Hegemann, Dirk, et al.; "PACVD-Derived Thin Films in the System Si-B-C-N"; *Chemical Vapor Deposition*; Mar. 1999; pp. 61-65; vol. 5 No. 2.

*Primary Examiner* — Jennifer C McNeil
*Assistant Examiner* — Vera Katz
(74) *Attorney, Agent, or Firm* — Kilpatrick Townsend & Stockton LLP

(57) ABSTRACT

The invention relates to a layer arrangement (1) for the formation of a coating on a surface (2) of a substrate (3), in particular on the surface (2) of a tool (3), wherein the layer arrangement comprises at least one hard layer (4, 5, 6, 7, 8) having the composition $Si_aB_bMe_cN_uC_vO_w$ with a,b>0 and 33 at %>c $\geq$0, preferably 25 at %>c$\geq$0, in particular 10 at %>c$\geq$0 and u,v,w$\geq$0, and Me being a metal. Furthermore, the invention relates to a coating method for depositing a layer arrangement (1), as well as to a substrate (3), in particular a tool (3) or a wearing part (3) having a layer arrangement (1) according to the invention.

20 Claims, 2 Drawing Sheets

U.S. PATENT DOCUMENTS

| | | |
|---|---|---|
| 2004/0126237 A1 | 7/2004 | Jackson et al. |
| 2004/0137281 A1* | 7/2004 | Ishikawa ........................ 428/702 |
| 2005/0003239 A1* | 1/2005 | Derflinger et al. ............ 428/698 |
| 2006/0154108 A1* | 7/2006 | Fukui et al. .................... 428/698 |
| 2006/0222893 A1* | 10/2006 | Derflinger ..................... 428/698 |
| 2006/0269788 A1* | 11/2006 | Ishikawa ........................ 428/698 |
| 2007/0149796 A1* | 6/2007 | Pfaltz et al. ....................... 556/16 |
| 2007/0157525 A1* | 7/2007 | Egan et al. ....................... 51/307 |
| 2008/0131726 A1* | 6/2008 | Derflinger ..................... 428/627 |

FOREIGN PATENT DOCUMENTS

| | | |
|---|---|---|
| EP | 0534066 A1 | 3/1993 |
| EP | 1191582 A1 | 3/2002 |
| EP | 1574594 A1 | 9/2005 |
| JP | 2000297365 A | 10/2000 |
| WO | WO 2005/078043 A1 | 8/2005 |

* cited by examiner

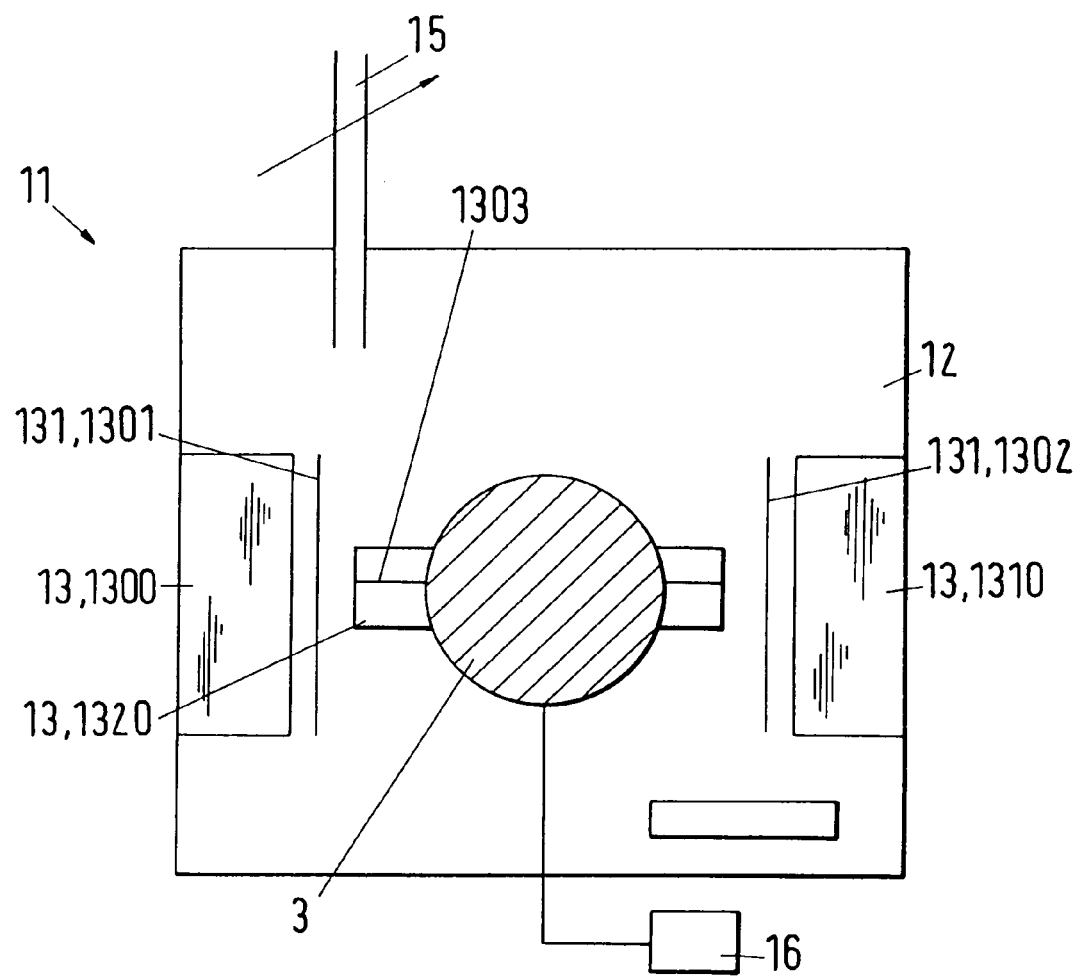

LAYER ARRANGEMENT FOR THE FORMATION OF A COATING ON A SURFACE OF A SUBSTRATE, COATING METHOD, AND SUBSTRATE WITH A LAYER ARRANGEMENT

CROSS-REFERENCES TO RELATED APPLICATIONS

This application claims the priority of European patent application No. 05405620.5, dated Nov. 4, 2005, the disclosure of which is incorporated herein by reference.

BACKGROUND OF THE INVENTION

The invention relates to a layer arrangement for the formation of a coating on a substrate, a coating method for depositing a layer arrangement, as well as a substrate, in particular a tool having a layer arrangement in accordance with the present invention.

The production of efficient tools is mostly realized by the formation of a coating on their surfaces. An important class of such coated tools is in particular, among other things, cutting tools in various embodiments. Typical materials to be coated are, among other things, tool steel and hard metals.

A known problem concerned with the coatings of such materials is both the high oxidation rate under the influence of air, even around 500° C., and the sag at relatively low temperatures (HSS ca. 550° C., hard metal ca. 650° C.).

Thus, preferably ceramic cutting members for the working of steels are used, e.g. ceramic cutting members on the basis of cubic boron nitride. For example for the high speed working of aluminum alloys and grey cast iron, SiN-ceramics are increasingly used. Thereby, ceramic materials prove to be more resistant in comparison to the metallic tool materials. A further improvement in performance can be achieved by a capable coating of the tools.

The hard coatings known from the state of the art are often based on classical compositions such as TiN, TiNC, CrN. These known hard coatings are limited with respect to their field of applications due to their special physical properties, especially with respect to their temperature load capacity. On the one hand, hardness is decreasing at elevated temperatures, and on the other hand, oxidation occurs even at relatively low temperatures, leading to an increasing wear of the coating.

To avoid these problems essentially two classes of coatings have been developed being, both, oxidation resistant in a range up to 1000° C. and having better properties with respect to hardness.

One class of coatings is Al-containing base layers such as AlTiN and AlCrN, wherein, dependent on specific requirements, additional elements can be alloyed. Typical compositions are compositions of the type AlTiXNCO, wherein X is e.g. Cr or another metal.

Another possibility known from the state of the art for improving the performance of coated tools is the combination of classical hard coatings acting as support layers with a finish-layer acting as a top-layer and having a respective function. In particular Si-coatings having a high Si content (10 at % or higher; at % means in the framework of this application "atom percent") of the type MeSiXNCO (X being an additional metal or B) such as TiSiN have to be mentioned which have an increased temperature load capacity.

In addition, it is for example also known to CVD-methods to deposit on indexable inserts oxidic ceramic-coatings such as $Al_2O_3$ using CVD-methods, in order to reduce wearing processes at elevated contact temperatures, in particular while turning on a lathe.

Under investigation are actually also boron-based coatings such as $B_4C$ as well as cubic BN coatings. However, cubic BN has the decisive disadvantage that it is extremely difficult to prepare. This is mainly due to difficulties in connection with the growth of the coating as such, as well as due to high internal stress in the coatings.

Regarding high temperature materials, volumetric-ceramic materials on the basis of SiN have been developed in recent years having greater hardness and improved oxidation resistance in comparison with SiC and $Si_3N_4$. Their special properties result from complex covalent chemical bonds and are due to low oxygen diffusion rates within the amorphe structure of SiCN.

Up to now it was only partly possible to provide coatings which meet the constantly increasing requirements with respect to mechanical properties, such as hardness and toughness, tribological properties such as affinity to adhesion at elevated temperatures, as well as friction, oxidation resistance and other characteristic properties, especially at extreme temperatures.

Moreover, the above-described improved coatings are procedurally difficult to prepare, so that the coated tools are very expensive and, as a result, from the economical point of view, in many cases coating is not worth while and tools being coated in such a way have only a limited market.

SUMMARY OF THE INVENTION

It is therefore an object of the present invention to provide an improved coating for a substrate, in particular for a tool, which overcomes the problems known from the state of the art, having in particular an improved tribological and oxidation behavior, improved mechanical properties, especially, but not only, with respect to the hardness, and which can be also used under excessive temperature conditions.

It is a further object of the invention to provide a method which allows a very reliable and simple way of depositing the coating according to the invention onto a substrate, wherein coating apparatuses, well known from the state of the art, can be used so that the coating process itself is feasible in a very economical way.

The subject matters of the invention which satisfy these objects are characterized by the features of the particularly advantageous embodiments of the invention disclosed herein.

Thus, the invention relates to a layer arrangement for the formation of a coating on a surface of a substrate, in particular on the surface of a tool, wherein the layer arrangement comprises at least one hard layer having the composition $Si_aB_bMe_cN_uC_vO_w$ with a,b>0 and 33 at %>c≧0, preferably 25 at %>c≧0, in particular 10 at %>c≧0 and u,v,w≧0, and Me being a metal.

The considerable improvement in capability of the tools and components in comparison with the state of the art is, in accordance with the invention, thus achieved by SiB-coatings.

According to the invention, it is therefore proposed to minimize, as the case may be, to eliminate the fraction of metallic components in the coating so that Si/B dominated coatings are used.

There is only little knowledge available due to the complex production of SiBx ceramics. The following information is available for $SiB_6$ volumetric materials: orthorhombic lattice, hardness ca. 2600, modulus of elasticity 290 GPa, density 2.43 g/cm³, thermal coefficient of expansion $4.6*10^{-6}/°$ C., thermal conductivity 9 W/mK, melting point 1950° C. In particular the high oxidation resistance must be mentioned: stable in air up to 1550° C.

Such a stability is not achieved by classical coating systems such as AlTiN, AlCrSiN and TiSiN.

These volumetric properties with respect to hardness and oxidation properties can similarly be found in coatings of the type SiBx, wherein the manufacture of these coatings has a certain industrial relevance.

The mechanism of oxidation protection of the SiBx-coatings is based upon the development of a double-layer of the type SiO/BO. The developing outer Si-enriched coating prevents the diffusion of oxygen into the coating.

Consequently, according to the invention, the new class of coating materials comprising SiBx, in particular the new class of coating materials comprising SiBCN, is proposed for use for the coating of tools.

Therefore, it surprisingly turned out that a coating on the basis of SiB- or SiBCN-compositions in combination with known classical hard coating results also in noticeably improved coating properties.

Depending on the demands required by the substrates or tools to be coated, it can be particularly advantageous to dope the coatings with oxygen, to come for example to SiBNCO-coatings, which, among other things, reduce the diffusion of oxygen by pre-oxidation as well as by refining of the structure of the coatings, and strongly increase the oxidation resistance even at high temperatures.

In addition, the doping with oxygen leads to an occupancy of the grain boundaries with oxygen so that at least in the case of a partial development of the above-mentioned double-layer systems, as well as of other double-layer systems, the tendency to structural transitions within the coatings, having frequently more or less open pores, is reduced, because by doping with oxygen a pre-oxidation is initiated.

According to the present invention, for the building of the coatings in accordance with the invention, it is decisive that the coatings comprise at least the two elements Si and B, in particular for the development of the protecting double-layer. That is, the coating system in accordance with the invention includes at least a hard layer of the composition $Si_aB_bMe_c N_uC_vO_w$ with a,b>0 and 33 at %>c≧0 and u,v,w≧0, wherein Me is a metal, in particular for example a metal being used for the production of the target such as Al in case of SiC or which metal can be a selective integrated metallic element.

The layers of the layer arrangement in accordance with the invention can be preferably deposited onto a suitable metallic intermediate layer, but onto a Si, SiC intermediate layer, as well as directly onto metallic or ceramic tool materials, or, preferably, onto tool materials being coated with hard layers.

Preferably, but not necessarily, the layers of a layer arrangement in accordance with the invention are largely in an amorphous state, wherein in a special embodiment a development of nano-crystalline regions inside the layers is present.

The thickness of the layers is in the range between ca. 5 nm-50000 nm, especially between 10 nm and 2500 nm, preferably between 100-500 nm, and can comprise e.g. Al-base-hard-layers in the form of a base coating.

The metallic component Me of the layer arrangement according to the invention is at least one metal of the group Al, Cr, Mo, W, V,Nb, Ta, Ti, Zr, HF, Mn, Fe; Co; Ni, Li, Be, Mg, Sc, Y, La, Ce, Nd, Sm.

Regarding a very preferred embodiment, on the surface of the substrate is at least one connecting layer, preferably a connecting layer provided, having the composition $Me_xE_yN_z$, with x,y≧0 and z>0, wherein Me is at least one metal of the group consisting of Al, Cr, Mo, W, V,Nb, Ta, Ti, Zr, HF, Mn, Fe; Co; Ni, Li, Be, Mg, Sc, Y, La, Ce, Nd, Sm and E being an element of the group consisting of Si, B, C, O.

For special applications, a special layer arrangement in accordance with the invention can also comprise a first hard layer having the composition $Si_aB_bMe_cN_uC_vO_w$, in particular a first hard layer having the composition $Si_aB_bMe_cC_vN_u$, in particular a first hard layer having the composition $Si_aB_b C_vN_u$.

In a special embodiment an AlTi-hard layer is provided, for example as a first hard layer and/or as another hard layer having the composition $(Al_{1-\alpha-\beta-\square}Ti_\alpha X_\beta)(N_{l-\gamma}C_\gamma O_\delta B_\epsilon)$, with 0.2<α<0.6, 0≦β<0.2 and α+β>0.01 and 0≦γ<0.5, 0≦δ<0.5, 0≦ε<0.5 and γ+δ+ε>0.01, wherein X is an element of the group consisting of Zr, V, Cr, Nb, Ta; W; Mo; Hf, Mg Si, Y.

The layers on the basis of SiB are deposited in an atomic composition of Si:B in the range of 9 to 0.1, wherein a crossfire of compositions within a gradient-mixed layer as well in the form of multi layers can be developed. Boron-enriched layers are preferably deposited; that is, the concentration of Si is smaller than the concentration of boron. In particular, composition with six boron atoms per Si atom is interesting, because very stable $SiB_6$-structures can be at least locally established inside the layers.

The addition of N, C, O leads to the development of a crossfire of bonding states in the layers; e.g. B—N, B—C, Si—N ,Si—C, Si—O, B—O bonds appear, which, however, are difficult to be quantified. The covalent fraction of bonds (e.g. SiN and BC) leads to a high hardness. The structural mechanism and the bonding mechanism of these complex coatings are up to now only insufficiently understood to make predictions on the complex layer properties.

In a preferred embodiment, the atomic composition of the layers should consist of about equal fractions of Si and boron and N or should consist of a composition comprising N, C, O. But a surplus-stoichiometric composition with respect to the contents of N and C relating to SiB is also possible, which is, however, difficult to produce. For example, a layer composition could make sense comprising approximately equal fractions of Si, B and C and a N-fraction which is about three times the Si-fraction according to the volumetric ceramic.

At least locally, the above-described preferred compositions can develop very stable compositions—in the form of $Si_3B_3N_7$ or $SiBN_3C$. Unlike the ceramics of this type, the PVD-layers are, by nature, layers having PVD specific structures such as growth-defects, growth-structures as well as residual stress due to growing processes.

The oxygen content within the layers is limited to less than 50%, and is preferably about 10 at % in relation to the whole composition, because the fraction of ionic bonds, leading as a rule to a brittle material behavior, should be limited.

In some embodiments, the fractions of metal in the layers are set up to less than 50 at %, wherein the metal fraction is mostly limited to 10 at % at a maximum, except for the intermediate layers. These fractions act as bond-bridges to a lower hard layer, as the case may be, and are from the target bonding agent.

The hardness of the coating is thereby between 1000 to 5000 Vickers, preferably between 2000 and 3500 Vickers. The selection of the capable coating is based on the respective tribological properties. For example in the case of various micro tools, the friction is a crucial point to avoid overheating, so that friction reducing boron oxide is desirable, wherein a hardness of the coating about 1000 Vickers can make sense already. The crucial point is a tribological segregation-coating. Under the influence of humidity, boron oxide transforms to boron-acid, leading to low friction values.

However, in the case of spherical cutters in direct contact to Ti-alloys, a high level of hardness should be adjusted.

To improve the adhesion properties on the substrate, e.g. in case of a strong stressed tool, between the substrate and the hard layer and/or between the connecting layer and the hard layer and/or between the first hard layer and the hard layer, an intermediate layer comprising the elements Si and/or C is provided.

Furthermore, it is possible that in another embodiment between the substrate and the hard layer and/or between the connecting layer and the first hard layer and/or between the first hard layer and the hard layer a gradient-mixed layer is provided, comprising the elements Si and/or C of the intermediate layer and having the composition $Si_aB_bMe_cN_uC_vO_w$, in particular $Si_aB_bMe_cC_vN_u$, and in more particular $Si_aB_bC_vN_u$ of the first hard layer. The composition of the gradient-mixed layer is changing more or less continuously starting with the composition of a first layer, the gradient-mixed layer being in contact with, towards a composition of, a second layer, which is in contact with the gradient-mixed layer, too, so that the first layer and the second layer, which may have different chemical or physical properties, such as different lattice structures, crystallinity, thermal coefficient of expansion, etc., can be optimally adapted to each other.

Particularly advantageous is an oxygen hard layer, having the composition $Si_aB_bMeN_uC_vO_w$, in particular having the composition $Si_aB_bN_uC_vO_w$ and which oxygen hard layer is in more particular provided as a protective hard layer. This protective hard layer can for example, but not only, prevent oxygen from diffusion into the layer, or at least minimize such oxygen diffusion, and can, thus, increase among other things the oxidation resistance. Moreover, the protective hard layer may protect the layer arrangement against influences from the environment, and can provide the layer arrangement with special chemical, thermal and mechanical properties, so that the layer arrangement is very good protected against e.g. high temperatures by the protective hard layer, and/or may provide the layer arrangement with particularly advantageous mechanical properties, or the layer arrangement will show good tribological properties.

The thickness of the connecting layer and/or of the intermediate layer and/or of the hard layer and/or of the first hard layer and/or of the gradient-mixed layer and/or of the oxygen hard layer and/or of the protective layer is between 5 nm and 50000 nm, especially between 10 nm and 5000 nm, in particular ca. 50 nm-5000 nm, preferably between 100 nm-500 nm, and in more particular between 80 nm and 600 nm.

The thickness of the connecting layer is preferably between 100 nm and 50000 nm, in particular between 100 nm and 3000 nm, the thickness of the first hard coating is between 100 nm and 3000 nm, preferably between 400 nm and 600 nm, the thickness of the intermediate layer and/or of the gradient-mixed layer is between 20 nm and 500 nm, preferably between 50 nm and 120 nm, and a thickness of the oxygen hard layer is between 10 nm and 100 nm, preferably between 40 nm and 60 nm.

It is understood that, depending on the special application, the above-described embodiments according to the invention can be combined in every suitable manner and that in particular the exemplarily described sequences of layers can be as well realized in other sequences, and it is possible that, in a special embodiment of a layer arrangement in accordance with the invention, one or more of the described layers may be not present, or that in another embodiment, one and the same layer arrangement may comprise a specific type of layer several times.

As above described in great detail, the invention is furthermore related to a coating method for depositing a layer arrangement onto a surface of a substrate, in particular onto the surface of a tool, in a process chamber of a coating apparatus. The coating apparatus comprises an RF-coating source having an RF-magnetron and/or a DC-coating source, in particular a DC-magnetron or a vacuum arc-evaporator, wherein the RF-coating source and/or the DC-coating source can be closed by a shutter, and wherein means are provided so that a process gas can be supplied into the process chamber. The method according to the invention includes the following steps: placing the substrate into the process chamber; heating the substrate to an ion-cleaning temperature; ion-cleaning the substrate at the ion-cleaning temperature; deposition of a layer arrangement having the composition $Si_aB_bMe_cN_uC_vO_w$ with a,b>0 and 33 at %>c≧0 and u,v,w≧0, wherein Me is a metal, using the RF-coating source and/or the DC-coating source.

In particular is 25 at %>c≧0, in more particular 10 at %>c≧0.

In one embodiment, a+b+c=100%, which can stand for that a layer of a layer arrangement in accordance with the invention may contain, for example, only Si, B and a metal.

In another embodiment the equation a+b+c=100% can stand for that a method of counting for determining the fraction of the elements being included in the composition $Si_aB_bMe_cN_uC_vO_w$ has been chosen, which method of counting is carried out in such a manner that the two sums (a+b+c) and (u+v+w) will each be equal to 100% separately, wherein it is possible that the elements N and/or C and/or O may not be present, as above already mentioned. An example for the aforementioned method of counting to indicate a composition is $Si_{0.3}B_{0.6}Cr_{0.1}N_{0.2}C_{0.5}O_{0.3}$. That is, the indication of the composition is given in such a way that Si, B and Me (in this case Cr) are equal to 100% and the second group of elements N, C, O add up to 100% likewise.

Regarding an embodiment which is very important in practice, the coating method comprises the following steps: placing the substrate into the process chamber; heating the substrate to the ion-cleaning temperature; ion-cleaning of the substrate at the ion-cleaning temperature and feeding a bias constant-voltage and/or an RF-voltage to the substrate to achieve an ion-cleaning; opening the shutter of the DC-coating source and/or the shutter of a first RF-coating source; deposition of a connecting layer onto the surface of the substrate, in particular a connecting layer having the composition $Me_xE_yN_z$, with x,y≧0 and z>0, wherein Me is at least a metal of the group consisting of Al, Cr, Mo, W, V,Nb, Ta, Ti, Zr, HF, Mn, Fe; Co; Ni, Li, Be, Mg, Sc, Y, La, Ce, Nd, Sm, and E being an element of the group consisting of Si, B, C, O; deactivating the DC-coating source and/or the first RF-coating source, opening a shutter of a second RF-coating source and putting the second RF-coating source into operation; deposition of an intermediate layer comprising the elements Si and/or C by using the second RF-coating source; opening a shutter of a third RF-coating source, putting the third RF-coating source into operation and depositing in parallel with the second RF-coating source $Si_aB_bMe_cN_uC_vO_w$, in particular $Si_aB_bMe_cC_vN_u$, in more particular $Si_aB_bC_vN_u$ according to the first hard layer by means of the second RF-coating source in order to deposit a gradient-mixed layer; deactivating the second RF-coating source and depositing a first hard layer having the composition $Si_aB_bMe_cN_uC_vO_w$, in particular $Si_aB_bMe_cC_vN_u$, in more particular $Si_aB_bC_vN_u$, and keeping the third coating source in operation until a preset thickness of the first hard layer is deposited; feeding a reactive gas, especially oxygen, nitrogen, or a carbon containing gas, into the process chamber and depositing an oxygen hard layer having the composition $Si_aB_bMe_cN_uC_vO_w$.

In one embodiment, the DC-coating source and/or the RF-coating source is a sputter source and/or an arc evaporation source.

According to the invention, the coating method itself can be a coating process being carried out by means of a PVD-method, in particular an RF-sputter method and/or a DC-sputter method and/or a CVD-method, especially a PE-CVD method and/or a Laser-CVD method and/or an ion implantation method and/or a laser-ablation method and/or an arc evaporation method, especially a cathodic and/or an anodic arc evaporation method.

Preferably, but not necessarily, the coating, which is deposited in direct contact with the surface of the substrate, e.g. which is deposited onto the surface of a tool, is deposited by means of an arc evaporation method, e.g. by anodic and/or cathodic arc evaporation.

In a special embodiment of a coating method in accordance with the invention, after the ion-cleaning of the substrate and before depositing the hard coating, a connecting layer, in particular a connecting layer having the composition $Al_xCr_yN_z$, with $x,y,z \geq 0$, is deposited onto the surface of the substrate, preferably by means of a DC-coating source.

Regarding another embodiment, between a first hard coating having the composition $Si_aB_bMeC_vN_u$, in particular $Si_aB_bC_vN_u$, and the substrate and/or between the connecting layer and the first hard coating, an intermediate layer is deposited comprising the elements Si and/or C.

Regarding a further embodiment, a gradient-mixed layer is deposited between the substrate and the hard coating and/or between the connecting layer and the first hard coating, which gradient-mixed layer comprises the elements Si and C of the intermediate layer and comprising the composition $Si_aB_bMeC_vN_u$, in particular $Si_aB_bC_vN_u$, of the first hard coating.

Thereby, in another embodiment of the invention which is very important in practice, a oxygen hard coating having the composition $Si_aB_bMeN_uC_vO_w$, in particular an oxygen hard coating having the composition $Si_aB_bN_uC_vO_w$, can be deposited on the substrate as a protective hard layer, onto the connecting layer and/or onto the first hard layer and/or onto the intermediate layer and/or onto a oxygen hard layer.

Regarding a very special embodiment, a metallic intermediate layer, e.g. a chromium, an aluminum or another metallic intermediate layer, can be provided to improve a connection between two layers, wherein the intermediate layer can be provided between the substrate and the connecting layer and/or between the connecting layer and the intermediate layer and/or between the intermediate layer and the hard coating and/or between the hard coating and the protective hard layer and/or between two other layers of the layer arrangement in accordance with the invention, wherein such a metallic intermediate layer can contribute to reduce residual stress in or between two successive layers.

The ion-cleaning temperature of a coating method in accordance with the invention is, preferably, between 100° C. and 1000° C., in particular between 250° C. and 800° C., and the ion cleaning is preferably, but not necessarily, carried out by applying a pulsed bias voltage to the substrate. During the building of the intermediate layer and/or the gradient-mixed layer, an electric RF-voltage can be applied to the substrate, too.

It is understood that the above-discussed embodiments of methods according to the invention are only exemplary and that, in special cases, the described methods can be combined in every suitable manner.

Furthermore, the invention is related to a substrate, in particular to a tool having a layer arrangement according to the invention and/or which layer arrangement is deposited with a coating method according to the present invention.

Among other things, the tool can be a cutting tool, especially a drill, a milling cutter, a tool for a turning lathe, or a plane, a conversion tool or a micro tool, in particular a conversion micro tool, a micro-indexable insert, a micro-milling cutter or another tool or another micro tool or a plastic tool.

It is understood that the layer arrangement in accordance with the invention can be particularly advantageously deposited onto a wearing part, in particular a wearing part for an air- or land-based turbine, for an engine, especially for a combustion engine, in particular a gasket, a gearwheel, a piton or onto another wearing part.

BRIEF DESCRIPTION OF THE DRAWINGS

In the following, the invention is described with reference to the schematic drawing.

FIG. 2 is a coating apparatus for carrying out the method according to the invention.

DESCRIPTION OF THE PREFERRED EMBODIMENTS

Figure 1:
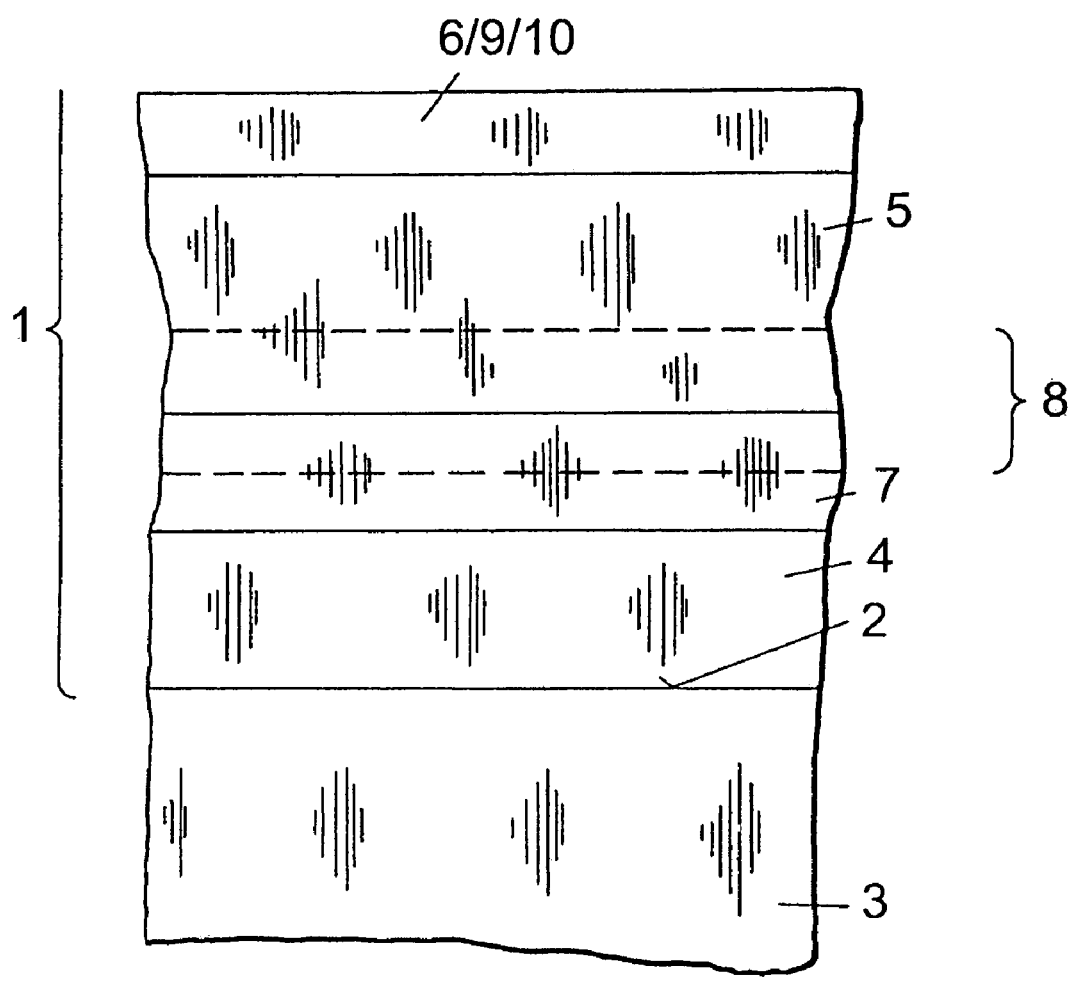
FIG. 1 is a layer arrangement in accordance with the invention.

In FIG. 1 a layer arrangement in accordance with the invention is schematically displayed, which layer arrangement is designated overall in the following by the reference numeral 1.

Onto the substrate 3, which can be e.g. a cutting tool, a connecting layer 4 is deposited. In the present embodiment, the connecting layer 4 is a connecting layer having the composition $Me_xE_yN_z$, with $x,y \geq 0$ and $z>0$, wherein Me is at least one metal of the group consisting of Al, Cr, Mo, W, Sc, Y, La, Ti, Zr, Hf, V, Nb, Ta, Mn, Tc, Re, Fe, Co Ni, Li, Ce and E is an element of the group consisting of Si, B, C, O. Especially, the connecting layer 4 is an AlCrN-layer having a thickness of about 2500 nm.

An SiC intermediate layer 7 is deposited onto the connecting layer 4, which intermediate layer 7 has e.g. a thickness of about 100 nm, and following the intermediate layer 7 a first hard coating 5 is provided, which has in the present example a thickness of about 500 nm. The first hard coating 5 is a $Si_aB_bMe_cN_uC_vO_w$ hard coating 5, in particular a first hard coating 5 having the composition $Si_aB_bMe_cC_vN_u$, in particular a hard coating 5 having the composition $Si_aB_bC_vN_u$, with $a,b>0$ and 33 at $\%>c\geq0$ and $u,v,w\geq0$, and wherein Me is a metal. The first hard coating 5 of the special embodiment displayed in FIG. 1 is e.g. a SiBCN hard coating.

In a special embodiment according to a layer arrangement as displayed in FIG. 1, the connecting layer 4 may have a thickness between 20 nm-50000 nm, the intermediate layer may have a thickness between 10 nm-1000 nm, the hard coating a thickness between 100 nm-5000 nm and the protective hard layer may have a thickness between 5 nm and 500 nm.

Preferably, the connecting layer has a thickness between 100 nm-2500 nm, the intermediate layer a thickness between 20 nm-500 nm, the hard coating between 100 nm-2500 nm and the protective hard layer a thickness between 10 nm and 50 nm.

The transition between the SiC intermediate layer 7 and the first hard coating 5 is realized via a gradient-mixed layer 8. The gradient-mixed layer 8 includes the elements Si and/or C of the intermediate layer 7 and includes the composition $Si_aB_bMe_cN_uC_vO_w$, in particular $Si_aB_bMe_cC_vN_u$, in more particular $Si_aB_bC_vN_u$ of the first hard layer 5, so that a more or less continuous transition from the composition of the intermediate layer 7 and the first hard coating 5, and vise versa, is assured.

As a top-layer 10 an oxygen hard coating 9 having the composition $Si_aB_bMeN_uC_vO_w$ in particular having the composition $Si_aB_bN_uC_vO_w$ is provided, protecting the layer arrangement against the environment.

Thereby, in a special embodiment the protective hard layer 10 can also be developed as a hard layer 6.

FIG. 2 shows schematically the bodywork of a coating apparatus 11, which is very suitable for the coating method in accordance with the invention. The as such well-known coating apparatus 11 comprises a process chamber 12, in which process chamber 12 of the special coating apparatus 11 according to FIG. 2 three different coating sources are provided, namely the two RF-coating sources 1300 and 1310, which are provided as displayed at the right process chamber wall and the left process chamber wall, respectively, and the DC-coating source 13, 1320, which is provided at a rear-plane of the process chamber 12. All coating sources 1300, 1310, 1320 include a shutter 131, which allows to shield each coating source 1300, 1310, 1320 separately and independently from each other, so that e.g. a respective coating source can be deactivated, without the need to deactivate the coating source as such.

For feeding a process gas, e.g. the sputter gas argon or the reactive gas $N_2$, $O_2$, $C_2H_2$ or for feeding another gas into the process chamber 12, means 15 are provided, which is in the present example an inlet pipe 15 which can be shut. In the process chamber 12, the substrate 3 to be coated is provided at a not shown carrier and is connected to a voltage source to be provided with a bias constant-voltage 16 or an RF-voltage 16.

In order to explain the mode of operation of the coating apparatus 11 in the course of the execution of a coating method in accordance with the invention, in the following a coating process is exemplarily described for the coating of a tool 3, which process is in practice of great importance.

After the tool 3 has been placed in the process chamber 12, the tool is heated, preferably at 250° C.-800° C. while the shutter 131 is shut. Then, an ion cleaning of the tool 3 is performed by applying a pulsed bias voltage 16 (AAFP asymmetric alternating field pulsing). In a successional first coating process the shutter 131 of the DC-coating source 13, 1320 is opened to deposit e.g. an AlCrN-connecting layer 4. The deposition of the connecting layer 4 can be performed by a DC sputter process or by a DC-arc evaporation process. During the deposition a bias voltage 16, preferably a negative bias voltage 16 of about 10-400 V, is applied to the tool 3, wherein a polarity changing pulsed bias voltage 16 (AAFP) can also be used.

The frequencies are e.g. in the range of 0.1 to 300 KHz, and the positive bias voltage is in particular in the range of 3 to 100 V. The pulse/pause ratio can be in the range of 0.1 to 0.95.

During the deposition of the connecting layer 4 the RF-magnetron 1310 is activated, wherein the respective shutter 131 is still closed.

Following, the shutter 131 is opened and, in dependence on the desired intermediate layer 7, an operation of the DC-magnetron 13, 1320 in parallel with the RF-magnetron 1310 is performed. In order to adjust a gradient the power of the magnetrons can be suitably changed.

Following, the shutter 1303 of the DC-coating source 1320 is closed and the DC-coating source is deactivated for the coating process.

Preferably an RF-voltage is now applied to the substrate 3.

The RF-coating source 1310 is used for the deposition of a $SiC_x$ intermediate layer 7 and comprises an Si-target or an SiC-target.

During the deposition of the intermediate layer 7, the second RF-magnetron 1300 is activated while the respective shutter 131 is still closed.

After having reached the desired thickness of the layer, in an additional step the shutter 131 of the coating source 1300 is now opened.

Depending on the desired intermediate layer 7 as a gradient-mixed layer, the first RF-magnetron 1310 and the RF-Magnetron 1300 are operated in parallel. In order to adjust the gradient the power of the magnetrons can be suitably changed.

Then the shutter 131 of the RF-magnetron 1310 is closed and thus disabled for the coating process.

An SiBNC-layer as a first hard coating 5 is deposited by the RF-coating source 1300. That is, the RF coating source 1300 includes in the present example a target comprising at least the elements SiB, preferably a composition of BN and SiC.

The operation of the SiBNC-coating source 1300 is kept on in order to deposit an SiBNC-layer as a first hard layer 5 onto the gradient-mixed layer 8. In a following step, a process gas, e.g. of oxygen, is supplied into the process chamber 12 through the inlet pipe 15. Preferably oxygen is supplied in order to deposit an SiBNCO-layer as a oxygen hard layer 9, which acts as a protective hard layer 10, wherein the coating process in accordance with the invention is e.g. performed such that the fraction of oxygen in the oxygen hard layer in the direction opposite to the surface of substrate (i.e. the fraction of oxygen in the direction to the outside) is increasing.

Preferably, according to the method in accordance with the invention, the substrate to be coated can be heated up to a temperature of about 300-800° C. Following, after having reached a common starting pressure (ca. 0.01 Pa), an ion cleaning, e.g. by means of the AEGD-process, is performed. The AEGD-process is well known to the person skilled in the art and, thus, there is no need to discuss this process in greater detail. For the deposition of the layers, in particular for the deposition of the connecting layer, a DC-Magnetron or a vacuum arc evaporation source including a suitable cathode material is used.

It is understood that in the process chamber 12 not only one but also three or more RF-coating sources or more than one DC-coating source 13 can be provided, depending on the special application and depending on the desired composition of the layers.

Consequently, the exemplary described methods in accordance with the invention can also be performed using three RF-coating sources 13, even if there are special requirements to the layers to be coated or to their chemical composition.

EXAMPLE 1

Placing hard metal micro tool at the carrier.
1) Heating up the tool to 500° C.
2) Ion cleaning ca. 30 min. at 200 V pulsed bias voltage, positive voltage 30 V, (20 Khz), pulse/pause 4, within the AEGD-process.
3) Deposition of an Al70Cr30-Schicht using DC-sputtering, TARGET POWER 5 W/cm2, bias voltage 50 V.
4) Reactive layer deposition of AlCrN by supplying N (nitrogen).

5) Metallic intermediate layer according to item 3.
6) Activating the RF-target, mixing ratio of the atomic composition Si:B being 1:6.**
7) Addition of N O (nitrogen, oxygen) in order to deposit a protective hard layer.

EXAMPLE 2

1) Heating up the tools to 500° C.
2) Ion cleaning ca. 30 min. at 200 V pulsed bias voltage, positive voltage 30 V, (20 Khz), pulse/pause 4, in the course of the AEGD-process.
3) Deposition of a TiAlSiN-coating by means of a vacuum arc evaporation source.
4) Switching on the RF-target having a target including a molar mixing of BN plus SiC in a ratio 1:1.
5) Addition of nitrogen and acetylene.
6) Addition of oxygen.

EXAMPLE 3

1) Heating up the tool to 500° C.
2) Ion cleaning ca. 30 min. at 200 V pulsed bias voltage, positive voltage 30 V, (20 Khz), pulse/pause 4, in the course of the AEGD-process.
3) RF-sputtering of SiC.
4) Addition of N (nitrogen).
5) Activating the RF-target according to example 2, item 4.
6) Deactivating of the SiC target.

Common pressures for sputtering are typically in the range of 0.1 bis 5 Pa.

Regarding the arc evaporation coating technique (arc-coating), typical discharge currents are between 30-200 A. A common diameter of arc-cathode is for example 100 mm. Typical pressures for arc coating are e.g. in the range between 1 Pa to 10 Pa.

The invention claimed is:

1. Layer arrangement for the formation of a coating on a surface of a substrate or tool, the layer arrangement comprising: at least one hard layer having a composition $Si_aB_bMe_cN_uC_vO_w$ with a,b>0 and 33 at %>c>0, and u, v, w>0, and Me being a metal.

2. Layer arrangement in accordance with claim 1, wherein Me is at least one metal of the group consisting of Al, Cr, Mo, W, V, Nb, Ta, Ti, Zr, HF, Mn, Fe, Co, Ni, Li, Be, Mg, Sc, Y, La, Ce, Nd, and Sm.

3. Layer arrangement in accordance with claim 1, wherein the surface of the substrate includes at least one connecting layer having a composition $Me_xE_yN_z$, with x>0, y≧0 and z>0, wherein Me is at least one metal of the group consisting of Al, Cr, Mo, W, V, Nb, Ta, Ti, Zr, HF, Mn, Fe, Co, Ni, Li, Be, Mg, Sc, Y, La, Ce, Nd, or Sm, and E being an element of the group consisting of Si, B, C, and O.

4. Layer arrangement in accordance with claim 3, wherein a first hard layer is provided having the composition $Si_aB_bMe_cN_uC_vO_w$, or having the composition $Si_aB_bMe_cC_vN_u$, or having the composition $Si_aB_bC_vN_u$.

5. Layer arrangement in accordance with claim 4, wherein between the substrate and the at least one hard layer and/or between the connecting layer and the at least one hard layer and/or between the first hard layer and the at least one hard layer an intermediate layer comprising the elements Si and/or C is provided.

6. Layer arrangement in accordance with claim 5, wherein between the substrate and the at least one hard layer and/or between the connecting layer and the first hard layer and/or the first hard layer and the at least one hard layer a gradient-mixed layer is provided, comprising the elements Si and/or C of the intermediate layer and having the composition $Si_aB_bMe_cN_uC_vO_w$, or $Si_aB_bMe_cC_vN_u$, or $Si_aB_bC_vN_u$ of the first hard layer.

7. Layer arrangement in accordance with claim 6, wherein an oxygen hard layer is provided, having the composition $Si_aB_bMeN_uC_vO_w$, or a composition $Si_aB_bN_uC_vO_w$, and an oxygen hard layer is provided as a protective hard layer.

8. Layer arrangement in accordance with claim 7, wherein the thickness of the connecting layer and/or of the intermediate layer and/or of the at least one hard layer and/or of the first hard layer and/or of the gradient mixed layer and/or of the oxygen hard layer and/or of the protective layer is between 5 nm and 50000 nm, especially between 10 nm and 5000 nm, or between 80 nm and 600 nm.

9. Coating method for depositing a layer arrangement in accordance with claim 1, wherein in a process chamber of a coating apparatus an RF-coating source, having an RF-magnetron and/or a DC-coating source and/or a DC-magnetron, is provided, wherein the RF-coating source and/or the DC-coating source and/or the DC-magnetron can be closed by a shutter, and wherein means are provided, so that a process gas can be supplied into the process chamber, and said coating method comprising the following steps:
   a.) placing the substrate into the process chamber;
   b.) heating the substrate to an ion-cleaning temperature;
   c.) ion-cleaning the substrate at the ion-cleaning temperature;
   d.) deposition of the layer arrangement using the RF-coating source and/or the DC-coating source and/or the DC-magnetron.

10. Coating method in accordance with claim 9 comprising the following steps:
   a.) placing the substrate into the process chamber;
   b.) heating the substrate to the ion-cleaning temperature;
   c.) ion-cleaning of the substrate at the ion-cleaning temperature and feeding a bias constant-voltage and/or an RF-Voltage to the substrate to achieve an ion-cleaning;
   d.) opening the shutter of the DC-coating source and/or the shutter of a first RF-coating source;
   e.) deposition of a connecting layer onto the surface of the substrate, in particular a connecting layer (4) having a composition $Me_xE_yN_z$, with x,y≧0 and z>0, wherein Me is at least a metal of the group consisting of Al, Cr, Mo, W, V, Nb, Ta, Ti, Zr, HF, Mn, Fe, Co, Ni, Li, Be, Mg, Sc, Y, La, Ce, Nd, or Sm, with E being an element of the group consisting of Si, B, C, O;
   f.) deactivating the DC-coating source and/or the first RF-coating source and/or the DC-magnetron, opening a shutter of a second RF-coating source and putting said second RF-coating source into operation;
   g.) deposition of an intermediate layer comprising elements Si and/or C by using the second RF-coating source;
   h.) opening a shutter of a third RF-coating source, putting said third RF-coating source into operation and depositing in parallel with the second RF-coating source $Si_aB_bMe_cN_uC_vO_w$, according to the at least one hard layer by means of the second RF-coating source in order to deposit a gradient-mixed layer;
   i.) deactivating the second RF-coating source and depositing the at least one hard layer having the composition $Si_aB_bMe_cN_uC_vO_w$, and keeping the third-coating source in operation until a preset thickness of the at least one hard layer is deposited;

j.) feeding a reactive gas comprising oxygen, nitrogen, or a carbon containing gas, into the process chamber and depositing an oxygen hard layer having the composition $Si_aB_bMe_cN_uC_vO_w$.

11. Coating method in accordance with claim 9, wherein the DC-coating source and/or the RF-coating source and/or the DC-magnetron is a sputter-source and/or an arc evaporating source.

12. Coating method in accordance with claim 9, wherein the coating process is carried out by means of a PVD-method, or an RF-sputter method and/or a DC-sputter method and/or a CVD-method and/or a PE-CVD method and/or a Laser-CVD method, and/or an ion-implantation method and/or a laser-ablation method and/or an arc-evaporation method and/or a cathodic and/or anodic arc-evaporation method.

13. A substrate or a tool coated by the coating method in accordance with claim 9.

14. Tool in accordance with claim 13, wherein the tool comprises a cutting tool, a drill, a milling cutter, a tool for a turning lathe or a plane, a conversion tool, a micro-tool, a micro-indexable insert, a micro-milling cutter, or a plastic tool.

15. Substrate in accordance with claim 13, wherein the substrate is a wearing part for an air- or land-based turbine, an engine, a wearing part of a combustion engine, a gasket, a gearwheel, or a piston.

16. Substrate in accordance with claim 1, wherein 25 at %>c>0.

17. Substrate in accordance with claim 1, wherein 10 at %>c>0.

18. Substrate in accordance with claim 1, wherein a+b+c=100%.

19. Layer arrangement for the formation of a coating on a surface of a substrate or tool, the layer arrangement comprising: at least one hard layer having a composition $Si_aB_bMe_cN_uC_yO_w$ with a,b>0 and 33 at %>c>0, and u,v,w>0, and Me being a metal, wherein the surface of the substrate includes at least one connecting layer having a composition $Me_xE_yN_z$, with x>0, y>0 and z>0, wherein Me is at least one metal of the group consisting of Al, Cr, Mo, W, V, Nb, Ta, Ti, Zr, HF, Mn, Fe, Co, Ni, Li, Be, Mg, Sc, Y, La, Ce, Nd, or Sm, and E being an element of the group consisting of Si, B, C, and O.

20. Substrate in accordance with claim 18, wherein u+v+w=100%.

* * * * *